(12) United States Patent
Wang et al.

(10) Patent No.: US 10,908,497 B2
(45) Date of Patent: Feb. 2, 2021

(54) MASK BOX

(71) Applicant: SHANGHAI MICRO ELECTRONICS EQUIPMENT (GROUP) CO., LTD., Shanghai (CN)

(72) Inventors: Gang Wang, Shanghai (CN); Rongjun Zhang, Shanghai (CN); Dongliang Huang, Shanghai (CN)

(73) Assignee: SHANGHAI MICRO ELECTRONICS EQUIPMENT (GROUP) CO., LTD., Shanghai (CN)

( * ) Notice: Subject to any disclaimer, the term of this patent is extended or adjusted under 35 U.S.C. 154(b) by 77 days.

(21) Appl. No.: 16/464,158

(22) PCT Filed: Nov. 15, 2017

(86) PCT No.: PCT/CN2017/111018
§ 371 (c)(1),
(2) Date: May 24, 2019

(87) PCT Pub. No.: WO2018/095249
PCT Pub. Date: May 31, 2018

(65) Prior Publication Data
US 2020/0117079 A1    Apr. 16, 2020

(30) Foreign Application Priority Data
Nov. 25, 2016   (CN) .......................... 2016 1 1061938

(51) Int. Cl.
*G03F 1/66* (2012.01)
*H01L 21/673* (2006.01)
(52) U.S. Cl.
CPC .......... *G03F 1/66* (2013.01); *H01L 21/67359* (2013.01)

(58) Field of Classification Search
CPC ......... G03F 1/66; G03F 1/62; H01L 21/67359
(Continued)

(56) References Cited

U.S. PATENT DOCUMENTS 4,422,547 A * 12/1983 Abe .......................... G03F 1/66
                                                         206/454
4,842,136 A *  6/1989 Nakazato .................. G03F 1/66
                                                          16/48.5
(Continued)

FOREIGN PATENT DOCUMENTS

CN        2534610 Y     2/2003
CN        2924591 Y     7/2007
(Continued)

*Primary Examiner* — Rafael A Ortiz
(74) *Attorney, Agent, or Firm* — Muncy, Geissler, Olds & Lowe, P.C.

(57) ABSTRACT

A reticle cassette includes a bottom panel, a frame arranged on the bottom panel, and a top cover arranged on the frame, the bottom panel, the frame and the top cover defining a chamber with an opening, the reticle cassette further providing a door panel at one side of the opening. The bottom panel is provided thereon with a plurality of reticle supporting posts each separated from the frame by a lateral gap, and the frame has a longitudinal cross-section comprising H-shaped structures. A web and a bottom surface of the first vertical wall are separated from the bottom panel by vertical gaps. The gaps are arranged between the reticle supporting posts and the frame so as to make the reticle cassette suitable for use with both vacuum suction type and physical clamping type handling forks to pick up the reticle.

15 Claims, 3 Drawing Sheets

(58) Field of Classification Search
USPC ....... 206/701, 706, 710, 722–724, 449, 555, 206/454, 455, 832
See application file for complete search history.

(56) References Cited

U.S. PATENT DOCUMENTS

| | | | |
|---|---|---|---|
| 5,296,893 A | 3/1994 | Shaw et al. | |
| 5,314,068 A * | 5/1994 | Nakazato | B65D 55/12 206/454 |
| 5,320,225 A * | 6/1994 | Kirkpatrick | G03F 1/66 206/449 |
| 5,743,409 A * | 4/1998 | Nakahara | G03F 1/66 206/710 |
| 2005/0007576 A1 | 1/2005 | Chiu | |
| 2005/0091781 A1 | 5/2005 | Yang et al. | |
| 2006/0061979 A1 | 3/2006 | Elliott et al. | |
| 2006/0120840 A1 | 6/2006 | Chiu et al. | |
| 2008/0041760 A1 | 2/2008 | Durben et al. | |
| 2008/0160235 A1* | 7/2008 | Wu | H01L 21/67353 428/34.1 |
| 2011/0155598 A1* | 6/2011 | Lu | G03F 1/66 206/349 |
| 2014/0069834 A1* | 3/2014 | Kuo | B65D 81/022 206/454 |
| 2014/0069835 A1* | 3/2014 | Kuo | B65D 81/052 206/454 |
| 2014/0138272 A1* | 5/2014 | Kuo | B65D 81/107 206/454 |

FOREIGN PATENT DOCUMENTS

| | | |
|---|---|---|
| CN | 101364557 A | 2/2009 |
| CN | 201236018 Y | 5/2009 |
| CN | 201327564 Y | 10/2009 |
| CN | 201352302 Y | 11/2009 |
| CN | 103105728 A | 5/2013 |
| CN | 202956584 U | 5/2013 |
| CN | 203133471 U | 8/2013 |
| CN | 203705817 U | 7/2014 |
| CN | 203720526 U | 7/2014 |
| CN | 103984203 A | 8/2014 |
| CN | 104071464 A | 10/2014 |
| CN | 205450558 U | 8/2016 |
| CN | 205539917 U | 8/2016 |
| EP | 5820164 | 2/1994 |
| EP | 1022615 A1 | 7/2000 |
| EP | 1022615 A1 | 7/2000 |
| JP | H0817906 A | 1/1996 |
| JP | 2001022053 A | 1/2001 |
| JP | 2002009133 A | 1/2002 |
| JP | 2012099663 A | 5/2012 |
| JP | 2014027217 A | 2/2014 |
| KR | 19970006725 B1 | 4/1997 |
| KR | 20010023465 A | 3/2001 |
| KR | 100567894 B1 | 4/2006 |
| KR | 100567894 B1 | 4/2006 |
| KR | 20080019997 A | 3/2008 |
| TW | 510004 | 11/2002 |
| TW | 200426520 A | 12/2004 |

* cited by examiner

MASK BOX

TECHNICAL FIELD

The present invention relates to the field of semiconductor fabrication and, in particular, to a reticle cassette.

BACKGROUND

In the field of semiconductor fabrication, reticles are usually stored and protected in reticle cassettes. Commonly-used existing 6" reticle cassettes are of the following three types: Nikon, Canon and SMIF (Standard Mechanical Interface). In practical fabrication, reticles are handled by handling forks of manipulators for reticle transfer. However, limited to structures of the reticle cassettes, especially the Nikon ones, the manipulators typically retain reticles on their handling forks by vacuum suction and are provided with no reticle protection structure. Since the vacuum suction approach is adopted to retain the reticles, it is not sufficiently reliable in practical use and the security of reticles cannot be guaranteed. Sin addition, collisions may occur when the handling forks of the manipulator are moving, which may seriously jeopardize the security of the reticles retained thereon.

SUMMARY OF THE INVENTION

The present invention solves the above-described low reticle security problem with the prior art by presenting a novel reticle cassette.

To this end, the subject matter of the present invention lies in a reticle cassette, comprising a bottom panel, a frame arranged on the bottom panel and a top cover arranged on the frame, the bottom panel, the frame and the top cover defining a chamber with an opening, the reticle cassette further provided with a door panel at a side of the opening, wherein the bottom panel is provided thereon with a plurality of reticle supporting posts each separated from the frame by a lateral gap, and wherein the frame has a longitudinal cross-section comprising H-shaped structures, a web of the H-shaped structure separated from the bottom panel by a vertical gap, a first vertical wall on an inner side having a bottom surface separated from the bottom panel by another vertical gap.

Additionally, the web of the H-shaped structure may be separated from the top cover by a vertical gap.

Additionally, the reticle cassette may further comprise bottom panel mounting posts disposed on the bottom panel and corresponding to second vertical walls on outer sides of the H-shaped structures.

Additionally, a distance from the bottom surface of the first vertical wall of the H-shaped structure to a bottom surface of a reticle placed in the reticle cassette is configured to be smaller than a thickness of the reticle but not smaller than a vertical movement range of a top surface of a handling fork when the handling fork picks up the reticle.

Additionally, the door panel may be provided with a barcode scanning area.

Additionally, the frame may comprise a left side panel and a right side panel in opposition to each other and a rear panel coupled to the left and right side panels at two ends, wherein each of the left and right side panels is provided with a top cover locking member.

Additionally, the reticle supporting posts may include two first supporting posts close to the opening and two second supporting posts away from the opening.

Additionally, distances from the two first supporting posts to the respective left and right side panels may be equal.

Additionally, distances between the two second supporting posts and the rear panel of the frame may be equal.

Additionally, the second supporting post may be positioned such that a distance between a reticle positioning plane of the second supporting post and the rear panel of the frame is greater than a distance between a reticle positioning of a handling fork for the reticle and the rear panel of the frame during picking up or placing of the reticle.

Additionally, the second supporting post may be positioned such that during picking up or placing of a reticle, a smallest distance from one side of the second supporting post to a proximal side of a handling fork for the reticle may be greater than 2 mm.

Additionally, the distance from the bottom surface of the first vertical wall of the H-shaped structure to the bottom surface of the reticle placed in the reticle cassette may be greater than 3 mm and smaller than the thickness of the reticle.

Additionally, the top cover may be movably coupled to a top of the rear panel of the frame.

Additionally, the top cover may be movably coupled to the door panel.

Additionally, the top cover may be provided with a labeling area on a top side thereof.

The reticle cassette of the present invention comprises a bottom panel, a frame arranged on the bottom panel and a top cover arranged on the frame. The bottom panel, the frame and the top cover define a chamber with an opening. The door panel is provided at the opening. The bottom panel is provided with a number of reticle supporting posts that are separated from the frame by lateral gaps. The frame each has a longitudinal cross-section comprising the H-shaped structures. The web and bottom surface of the first vertical walls of the H-shaped structure are separated from the bottom panel by vertical gaps. The chamber defined by the bottom panel, the frame and the top cover can be used to store a reticle and accommodate reticle pickup and placement operations of a handling fork. The reticle can be supported on the reticle supporting posts arranged on the bottom panel, and the gaps arranged between the reticle supporting posts and the frame make the reticle cassette suitable for use with both vacuum suction type and physical clamping type handling forks to pick up the reticle. As the frame each has a longitudinal cross-section comprising H-shaped structures, and the gaps are arranged between the web and the bottom surface of the first vertical wall and the bottom panel, the reticle cassette can adapt not only to a handling fork without reticle protection but also to a handling fork equipped with reticle protection to pick up the reticle. All of these greatly enhance its versatility.

In these figures: 1, a bottom panel; 11, a bottom panel mounting post; 2, a frame; 21, a web; 22, a first vertical wall;

23, a second vertical wall; 24, a left side panel; 25, a right side panel; 26, a rear panel; 27, a top cover locking member; 3, a top cover; 4, a door panel; 41, a barcode scanning area; 51, a first supporting post; 52, a second supporting post; 6, a labeling area; 7, a reticle; 8, a spring assembly; 81, a lateral leg; and 82, a vertical leg.

DETAILED DESCRIPTION

The present invention will be described in detail below with reference to the accompanying drawings.

Figure 3:
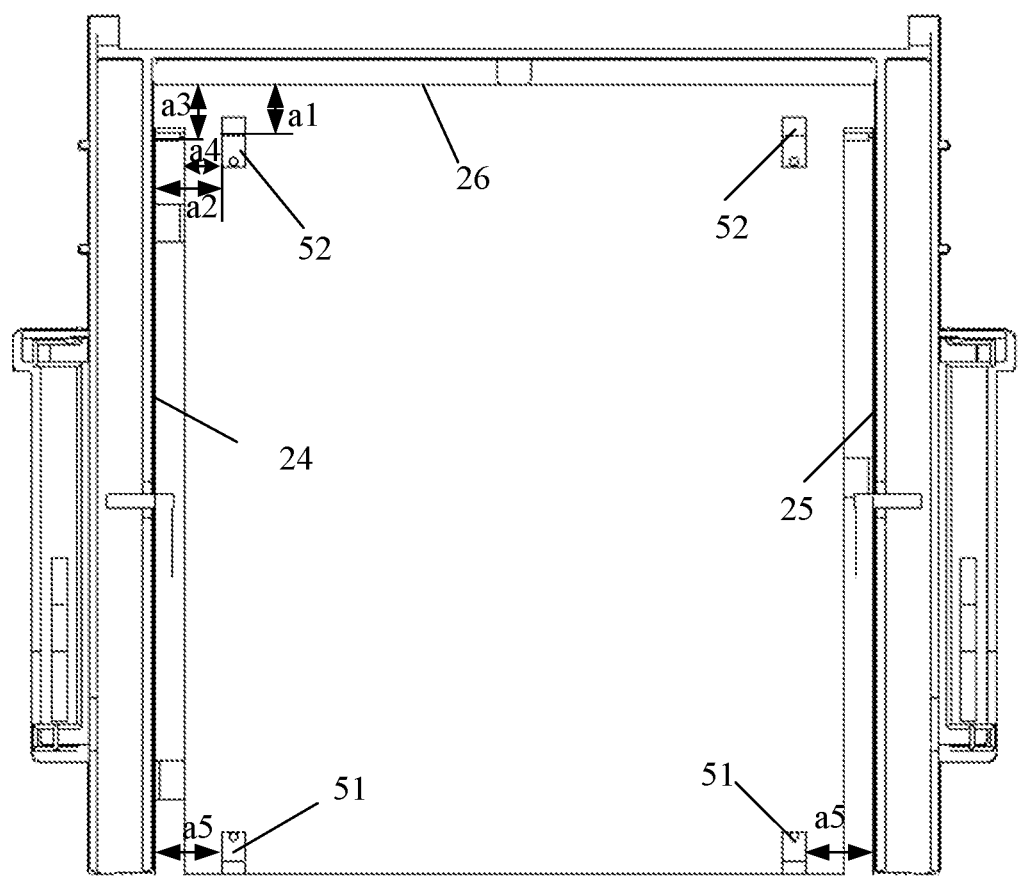
FIG. 3 is a diagram showing an arrangement of first and second supporting posts according to the present invention.
Figure 4:
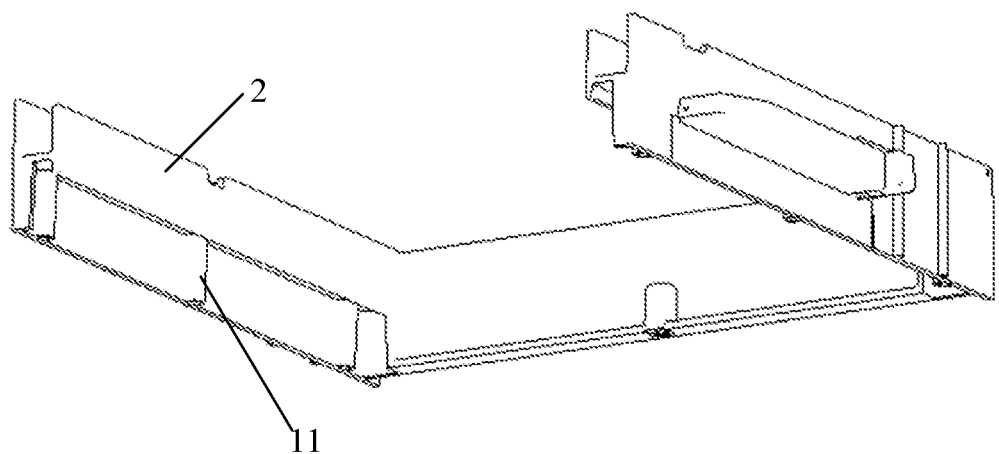
FIG. 4 is a structural schematic of a frame according to the present invention.
Figure 5:
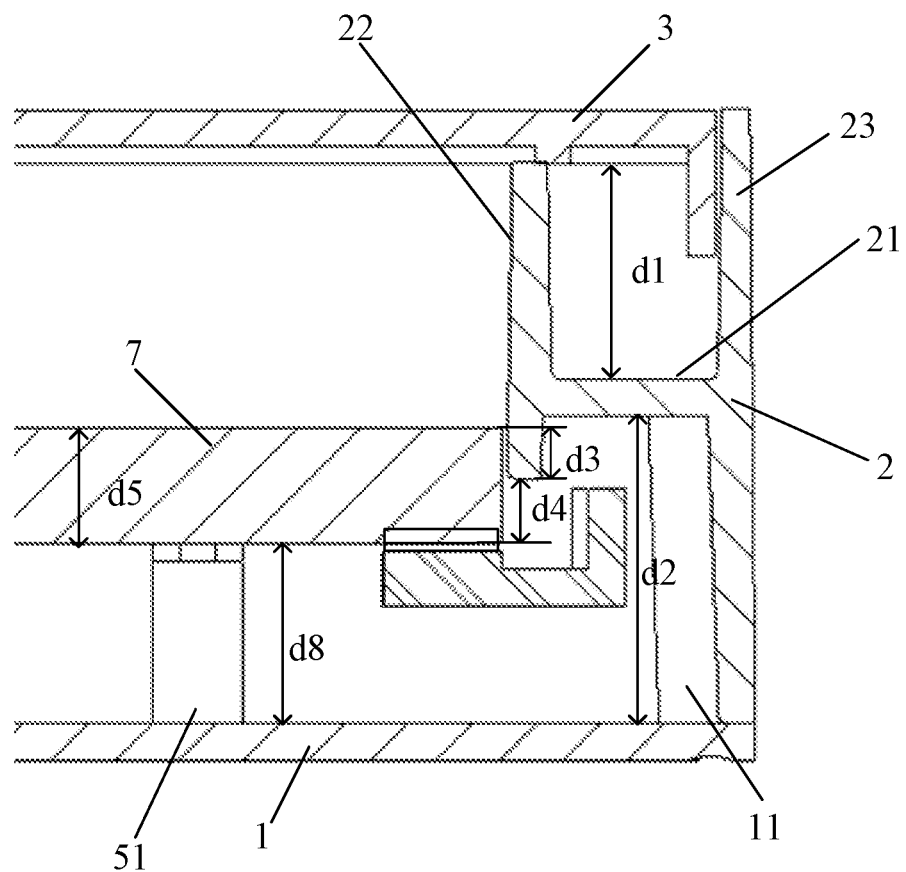
FIG. 5 is a dimensioned cross-sectional view of the frame according to the present invention.

As shown in FIGS. 1-5, the present invention provides a reticle cassette including a bottom panel 1, a frame 2 arranged on the bottom panel 1 and a top cover 3 arranged on the frame 2. The bottom panel 1, the frame 2 and the top cover 3 define a side opening chamber for storing a reticle 7 of a 5" or 6" size. The size of the chamber is adapted to the size of the reticle 7, and a door panel 4 is provided at the opening side. A number of reticle supporting posts are provided on the bottom panel 1 and separated from the frame 2 by lateral gaps. With this arrangement, the reticle cassette allows the reticle to be picked up either by vacuum suction or physical clamping. A longitudinal cross-section of the frame 2 comprises H-shaped structures, as shown in FIG. 5, in which one H-shaped structure arranged on one side of the frame 2 is shown. Vertical gaps between bottom panel 1 and the web 21, and a bottom surface of a first vertical wall 22 on inner side of the H-shaped structure are arranged. The vertical gap can provide a movement space for reticle protection member equipped on a handling fork with a reticle protection device so that the reticle cassette is adapted to pick up the reticle by the handling fork equipped with the reticle protection device and a handling fork not equipped with such reticle protection device.

Preferably, the web 21 of the H-shaped structure is separated from the top cover 3 by a gap to guarantee a movement space of a spring assembly 8 (see FIG. 2) arranged between the top cover 3 and the bottom panel 1. In the illustrated embodiment, there are two spring assemblies 8 arranged respectively on the left and right sides of the top cover 3. Each of the spring assemblies 8 is an inverted L-shaped structure composed of a lateral leg 81 arranged on the left or right side of the top cover 3 and a vertical leg 82 movably connected to the lateral leg 81. During use, i.e., when the top cover 3 is operably disposed on the frame 2, lower ends of the vertical legs 82 correspond to gaps between the webs 21 of the H-shaped structures and the top cover 3. The reticle cassette is closed and pressed by the top cover 3 under the action of spring forces.

Preferably, as shown in FIGS. 4 and 5, the bottom panel 1 is provided thereon with a number of bottom panel mounting posts 11. Positions of the bottom panel mounting posts 11 correspond to second vertical walls 23 on outer side of the H-shaped structures. Compared to the prior art, the bottom panel mounting posts 11 are shifted from middle to the edges, creating enough space for the insertion and withdrawal of the handling fork.

Preferably, the distance from the bottom surfaces of the first vertical walls 22 on inner side of the H-shaped structures to a top surface of the reticle 7 (when it is placed within the reticle cassette) is taken as a positioning reference between the reticle 7 and the reticle cassette.

As shown in FIG. 5, in the illustrated embodiment, the distance between the webs 21 and the top cover 3, denoted at d1, is equal to 12 mm, and the distance between the bottom sides of the webs 21 and the bottom panel 1, denoted at d2, is preferably equal to 17 mm so as to guarantee a desired movement space for the handling fork of the reticle protection device between upper and lower movement limits. Moreover, a support height of the reticle 7, i.e., the distance from a bottom surface of the reticle 7 to the bottom panel 1, denoted at d8, is preferably 10 mm, so that it is at least greater than the sum of a thickness of the handling fork and a vertical movement range of a bottom surface of the handling fork required to accomplish the placement of the reticle. Additionally, the distance from the bottom surfaces of the first vertical wall 22 to the top surface of the reticle 7, which is used as the positioning reference between the reticle 7 and the reticle cassette as noted above, is denoted at d3 and preferably 11 mm. The distance d3 can be measured as a basis for calculating the distance between the bottom surfaces of the first vertical walls 22 and the bottom surface of the reticle 7, denoted as d4. The distance d4 should be smaller than the thickness of the reticle 7 but not a vertical movement range of a top surface of the handling fork required to accomplish the pickup of the reticle and is preferably greater than 3 mm, i.e., d4>3 mm.

Preferably, the door panel 4 is provided with a barcode scanning area 41 which facilitates monitoring and management of the reticle.

Preferably, the frame 2 includes a left side panel 24, a right side panel 25 opposing the left side panel 24 and a rear panel 26 coupled at both ends to the left and right side panels 24, 25. In addition, each of the left and right side panels 24 is provided with a top cover locking member 27 for locking the top cover 3.

As shown in FIG. 3, the reticle supporting posts may include two first supporting posts 51 close to the open side and two second supporting posts 52 farther away from the open side. Preferably, the distances between the left and right side panels 24, 25 of the frame 2 and the respective first supporting posts 51 are equal. Specifically, the distance between the left first supporting post 51 and the left side panel 24 is equal to the distance between the right first supporting post 51 and the right side panel 25, and both these distances are denoted at a5. Preferably, the distances between the respective second supporting posts 52 and the rear panel 26 of the frame 2 are equal.

Preferably, the distance between a positioning plane defined by the second supporting posts 52 and the rear panel 26 of the frame, denoted at a1, is greater than the distance between a reticle positioning plane of reticle handling fork and the rear panel 26 of the frame 2 when picking up or placing the reticle 7, denoted at a3. In the embodiment shown in FIG. 3, a positioning plane defined by the second supporting posts 52 and the rear panel 26 of the frame has a distance a1=12 mm and positioning plane of the reticle 7 and the rear panel 26 of the frame 2 when handling fork extends to the farthest position for picking up or placing the reticle has a distance a3=11 mm. in this embodiment a3−a1=1 mm. In addition, the distances between the left and right side panels 24, 25 of the frame 2 and the respective second supporting posts 52 are also equal. In FIG. 3, only the distance between the left second supporting post 52 and the left side panel 24 is shown and denoted as a2. During the handling fork is inserted into the reticle cassette to pick up or place the reticle, a2 is required to allow a distance between the side of second supporting post 52 and a proximal side of the handling fork, denoted as a4, which is greater than 2 mm. In the illustrated embodiment, a4=14.5 mm.

Preferably, the top cover 3 is provided on its top side with a labeling area, e.g., a logo area, for reducing a confusion risk made by a handler who is handling the reticle cassette.

Figure 1:
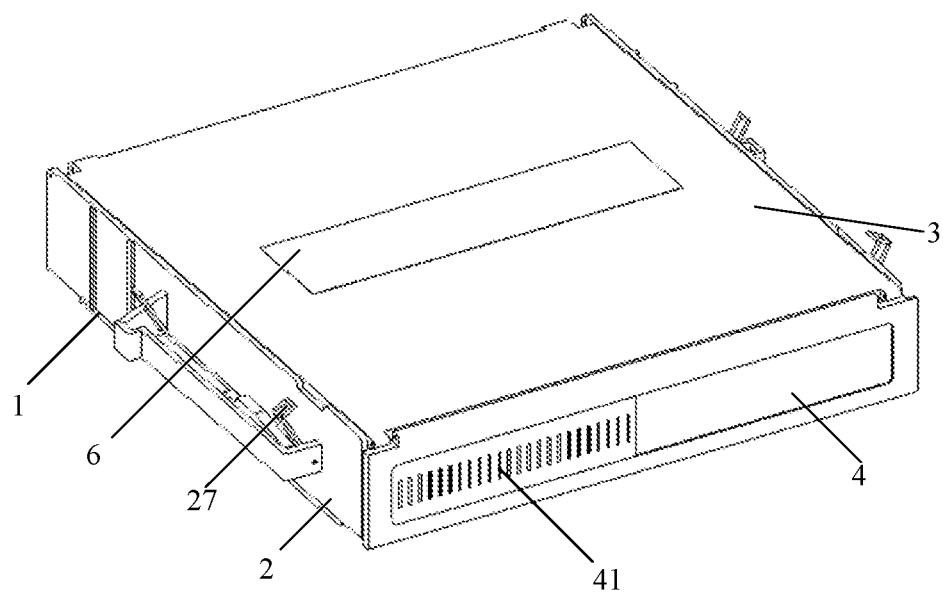
FIG. 1 is a structural schematic of a reticle cassette according to the present invention.
Figure 2:
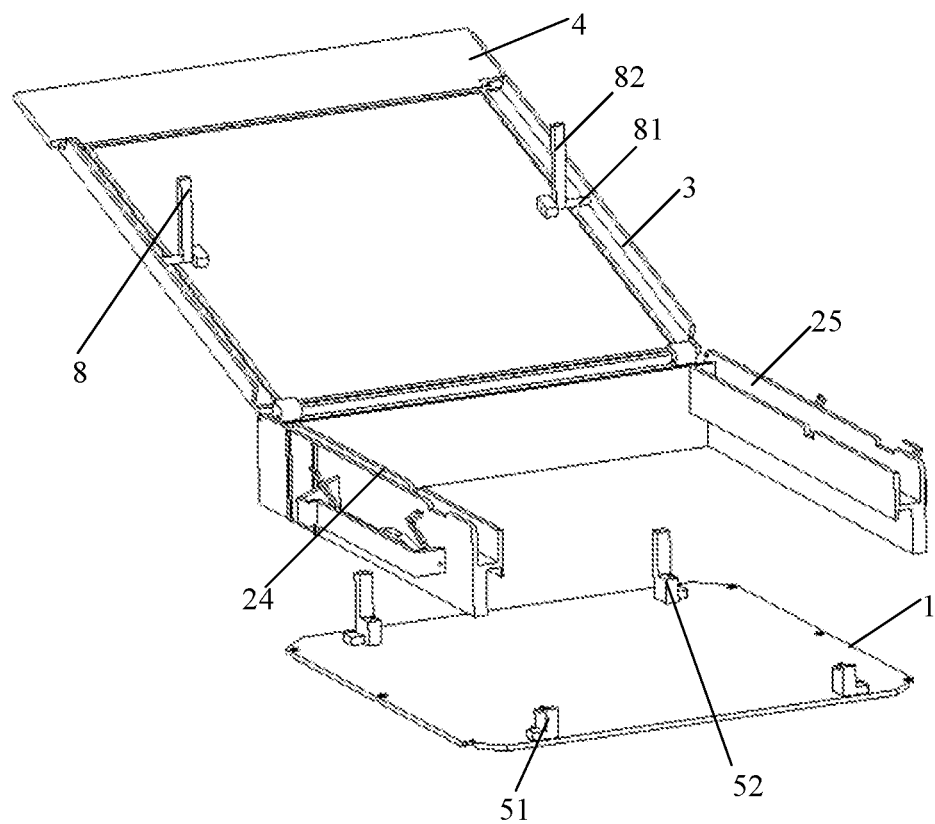
FIG. 2 is an exploded view of the reticle cassette according to the present invention.

With particular reference to FIG. 2, the top cover 3 may be movably, e.g., pivotably, connected to a top of the rear panel 26 of the frame 2 so that the top cover 3 can pivot with respect to the frame 2 to achieve an open or close of the top cover 3. The top cover 3 may be also movably connected to the door panel 4 to allow the door panel 4 to pivot with respect to the top cover 3. In this way, the door panel 4 can be opened or closed to enable the pick up or placement of the reticle 7.

To sum up, the present invention provides a reticle cassette comprising a bottom panel 1, a frame 2 arranged on the bottom panel 1 and a top cover 3 arranged on the frame 2. The bottom panel 1, the frame 2 and the top cover 3 together delimit a chamber with an opening. The door panel 4 is provided at the opening. The bottom panel 1 is provided thereon with a number of reticle supporting posts. Gaps are provided between the reticle supporting posts and the frame 2 gap. A longitudinal cross section of the frame 2 comprises H-shaped structures. Gaps are provided between the bottom panel 1 and web 21, and lower surface of a first vertical wall 22 on inner side of the H-shaped structure. The chamber with an opening is delimited by the bottom panel 1, the frame 2 and the top cover 3 so as to store a reticle 7 and to pickup and place the reticle 7 by a handling fork. A number of reticle supporting posts are arranged on the bottom panel 1 so as to support the reticle 7, and the gaps are arranged between the reticle supporting posts and the frame 2 so as to make the reticle cassette suitable for use with handling forks that pick up and retain the reticle respectively by vacuum suction and physical clamping. Moreover, a longitudinal cross section of the frame 2 is arranged to comprise H-shaped structures, and the gaps are arranged between the bottom panel 1 and the webs 21, and the bottom surfaces of the first vertical walls 22 of the H-shaped structures so that the reticle cassette can not only adapt to a handling fork without reticle protection but also to a handling fork equipped with reticle protection. All of these greatly enhance its versatility.

Although some embodiments of the present invention have been described herein, these embodiments are merely illustrative and are not intended to be construed as limiting the scope of the invention. Various omissions, substitutions and changes made without departing from the spirit of the invention are all intended to be included within the scope thereof.

What is claimed is:

1. A reticle cassette, comprising a bottom panel, a frame arranged on the bottom panel and a top cover arranged on the frame, the bottom panel, the frame and the top cover defining a chamber with an opening, the reticle cassette further provided with a door panel at a side of the opening, wherein the bottom panel is provided thereon with a plurality of reticle supporting posts each separated from the frame by a lateral gap, and wherein the frame has a longitudinal cross-section comprising H-shaped structures, a web of the H-shaped structure separated from the bottom panel by a vertical gap, a first vertical wall on an inner side having a bottom surface separated from the bottom panel by another vertical gap.

2. The reticle cassette of claim 1, wherein the web of the H-shaped structure is separated from the top cover by a vertical gap.

3. The reticle cassette of claim 1, further comprising bottom panel mounting posts disposed on the bottom panel and corresponding to second vertical walls on outer sides of the H-shaped structures.

4. The reticle cassette of claim 1, wherein a distance from the bottom surface of the first vertical wall of the H-shaped structure to a bottom surface of a reticle placed in the reticle cassette is configured to be smaller than a thickness of the reticle but not smaller than a vertical movement range of a top surface of a handling fork when the handling fork picks up the reticle.

5. The reticle cassette of claim 1, wherein the door panel is provided with a barcode scanning area.

6. The reticle cassette of claim 1, wherein the frame comprises a left side panel and a right side panel in opposition to each other and a rear panel coupled to the left and right side panels at two ends, and wherein each of the left and right side panels is provided with a top cover locking member.

7. The reticle cassette of claim 6, wherein the reticle supporting posts include two first supporting posts close to the opening and two second supporting posts away from the opening.

8. The reticle cassette of claim 7, wherein distances from the two first supporting posts to the respective left and right side panels are equal.

9. The reticle cassette of claim 7, wherein distances between the two second supporting posts and the rear panel of the frame are equal.

10. The reticle cassette of claim 7, wherein the second supporting post is positioned such that a distance between a reticle positioning plane of the second supporting post and the rear panel of the frame is greater than a distance between a reticle positioning plane of a handling fork for a reticle and the rear panel of the frame during picking up or placing of the reticle.

11. The reticle cassette of claim 7, wherein the second supporting post is positioned such that during picking up or placing of a reticle, a smallest distance from one side of the second supporting post to a proximal side of a handling fork for the reticle is greater than 2 mm.

12. The reticle cassette of claim 4, wherein the distance from the bottom surface of the first vertical wall of the H-shaped structure to the bottom surface of the reticle placed in the reticle cassette is greater than 3 mm and smaller than the thickness of the reticle.

13. The reticle cassette of claim 6, wherein the top cover is movably coupled to a top of the rear panel of the frame.

14. The reticle cassette of claim 1, wherein the top cover is movably coupled to the door panel.

15. The reticle cassette of claim 1, wherein the top cover is provided with a labeling area on a top surface thereof.

* * * * *